United States Patent [19]

Nakagawa et al.

[11] Patent Number: 4,874,460
[45] Date of Patent: Oct. 17, 1989

[54] METHOD AND APPARATUS FOR MODIFYING PATTERNED FILM

[75] Inventors: Yoshitomo Nakagawa; Takehiro Yamaoka, both of Tokyo, Japan

[73] Assignee: Seiko Instruments Inc., Tokyo, Japan

[21] Appl. No.: 272,017

[22] Filed: Nov. 16, 1988

[30] Foreign Application Priority Data

Nov. 16, 1987 [JP] Japan .................................. 62-288656
May 6, 1988 [JP] Japan .................................. 63-110191

[51] Int. Cl.[4] .................. B44C 1/22; C03C 15/00; C03C 25/06; C23F 1/02
[52] U.S. Cl. ................................. 156/626; 156/345; 156/627; 156/643; 156/646; 156/656; 156/667; 204/192.34; 204/298
[58] Field of Search ............... 156/345, 626, 643, 640, 156/646, 654, 627, 655, 656, 667; 204/192.32, 192.33, 192.34, 192.35, 192.37, 298 BE; 219/121.33, 121.51, 121.55, 121.84; 250/492.1, 492.2, 492.3

[56] References Cited

U.S. PATENT DOCUMENTS

| | | | |
|---|---|---|---|
| 4,101,772 | 7/1978 | Konishi et al. | 204/192.34 X |
| 4,457,803 | 7/1984 | Takigawa | 156/345 X |
| 4,559,096 | 12/1985 | Friedman et al. | 204/192.34 X |
| 4,639,301 | 1/1987 | Doherty et al. | 204/192.34 X |
| 4,734,158 | 3/1988 | Gillis | 204/298 BE |
| 4,756,794 | 7/1988 | Yoder | 156/345 X |

OTHER PUBLICATIONS

WO-A-8 602 774 (Ion Beam Systems), Figures; p. 4, line 19-p. 5, line 23, p. 12, lines 12-24; p. 9, lines 1-3, International Publication date May 9, 1986.
Journal of Vacuum Science & Technology/B, vol. 3, No. 1, second series, Jan./Feb. 1985, pp. 67-70, Woodbury, N.Y., US; Y. Ochiai, et al.: "Pressure and Irridiation Angle Dependence of Maskless Ion Beam Assisted Etching of GaAs and Si", p. 67, paragraph II.

Primary Examiner—William A. Powell
Attorney, Agent, or Firm—Spensley Horn Jubas & Lubitz

[57] ABSTRACT

Apparatus for modifying a patterned film, composed of an ion source for producing an ion beam which is focused and caused to impinge upon a sample to microscopically machine a small region upon the surface of the sample; scanning electrodes and a scanning control cirucit for scanning the focused ion beam; a detector that detects the secondary charged particles emanating from the sample in response to the irradiation; and a display device for displaying the pattern formed upon the sample according to the output from the detector. The apparatus further includes a nozzle for spraying etching gas against only a certain portion of the pattern when the focused ion beam is caused to fall upon the certain portion of the pattern, the gas being activated by the ion beam and capable of etching the material of the film upon which the pattern is formed. The focused ion beam that irradiates and scans the sample is not permitted to move from one spot to a neighboring spot until a given period of time elapses. Thus, a desired portion of the patterned film is rapidly and cleanly removed while minimizing the amount of the etching gas admitted into the apparatus.

7 Claims, 4 Drawing Sheets

METHOD AND APPARATUS FOR MODIFYING PATTERNED FILM

BACKGROUND OF THE INVENTION

The present invention relates to method and apparatus for locally removing a patterned film when the film is to be modified, the film being a mask or reticle used either in a semiconductor integrated circuit or during fabrication of a semiconductor integrated circuit.

For example, a mask which is subject to such an operation could be constituted by a film, or layer, of Cr, Mo, a Cr and chromium oxide film combination, or an Mo and molybdenum oxide film combination, on a glass substrate.

Such procedure can also be performed on a wiring and/or passivation layer on an IC wafer.

A conventional apparatus for modifying a patterned film is shown in FIG. 2, where ions are produced from an ion source 1. The ions are passed through an ion optics including condenser lenses 2 and objective lenses 3 so that the beam 5 is focused to a given radius of less than $1\mu$. Then, the beam passes between scanning electrodes 4 and scans the surface of a sample 6.

An XY stage 7 is moved in accordance with preset data so that a desired portion of the patterned film on the surface of the sample 6 is located immediately below the focused ion beam, or the beam 5 is scanned. Secondary charged particles 8 are emitted from the surface of the sample 6 in response to irradiation by the beam 5. Those particles 8 are detected by a detector 9. The output signal from the detector 9 is fed to an electronic circuit such as an A/D converter 10. The pattern in which the secondary charged particles are detected is displayed on a display device 11. This permits one to observe or check the patterned film with the naked eye. Then, the sample 6 is moved by the XY stage 7 to cause the portion of the film to be removed to fall within the range scanned by the focused ion beam.

The position and the range of the portion of the patterned film to be removed are set. The range scanned by the beam is set, using the scanning electrodes 4 or blanking electrodes 12, in order that the ion beam fall on only a desired portion of the surface of the sample 6 and scan it. In this way, the beam is caused to scan only the desired portion of the patterned film and so the desired portion is repeatedly irradiated. The patterned film on the desired portion is etched away by the ion sputtering. Generally, this requires repeated irradiation of the material to be removed.

FIG. 4 illustrates a sequence in which the focused ion beam is scanned by the prior art techniques. The beam is scanned over an area 24 which is to be modified. The beam is moved across spots $1, 2, 3, \ldots, i-1, i, \ldots, k-1, k$ in that order. The same frame of scan is repeated. The beam halts for a given time at each spot. Usually, the distance between successive spots is less than the whole width of the ion beam. The beam shifts momentarily from one spot to the next and, therefore, the raster scan is continuous as a whole. FIG. 5 shows the spatial distribution of the intensity, at the sample surface, of the focused ion beam which scans the line beginning with spot 1 and ending with spot $i-1$. Spots $1, 2, \ldots, i-1$ of FIG. 5 correspond to spots $1, 2, \ldots, i-1$ of FIG. 4. In FIG. 5, when the beam reaches each of spots 1, 2, 3, the region irradiated by the beam assumes distribution curves 1, 2, 3, respectively. As can be seen from FIG. 5, the distribution curves 1, 2, 3 overlap each other.

In the conventional method and apparatus for modifying a patterned film, a desired portion of the film is removed only by sputtering with the focused ion beam. Therefore, it takes a very long time to fully remove the desired portion. As shown in FIG. 3, the pattern formed on a substrate 14 is etched away by sputtering. The material of the patterned film is sputtered on the side walls of a removed portion or on the surroundings. As a result, a deposit 13 is formed. Consequently, the sputtering etching is not done effectively. Further, the speed of removal is low.

A portion of a substrate surface, at which a pattern film is removed by a focused ion beam, is implanted with the ions. Therefore, the quality of the portion of the substrate surface changes. For example, in case the substrate is comprised of a photomask, the transparency deteriorates. And in case the substrate is composed of a semiconductor, the electric characteristics change.

SUMMARY OF THE INVENTION

It is an object of the invention to provide an improved method and apparatus for modifying a pattern film.

This and other objects are achieved, according to the invention, by an apparatus for modifying a patterned film on a sample surface, comprising:

means for producing a focussed ion beam and for causing the beam to impinge upon the sample surface to microscopically machine a small region of the surface which contains the patterned film, impingement of the beam causing secondary charged particles to be emitted from the sample surface;

scanning means disposed for causing the focussed beam to scan the sample surface;

detecting means disposed for detecting the secondary charged particles emitted from the sample surface in response to impingement of the beam;

display means connected to said detecting means for producing a display of the pattern of the film in response to the output of said detecting means;

means disposed for spraying etching gas capable of etching the film onto the surface region while the beam is being caused to scan the region; and scanning control means coupled to said scanning means for causing the beam to impinge on each one of a plurality of spots in the region in a given sequence and to impinge on each spot for a given period of time.

A method for modifying a patterned film on a sample surface, comprising:

producing a focussed ion beam and causing the beam to impinge upon the sample surface to microscopically machine a small region of the surface which contains the patterned film, impingement of the beam causing secondary charged particles to be emitted from the sample surface;

causing the focussed beam to scan the sample surface by impinging on each one of a plurality of spots in the region in a given sequence and impinging on each spot for a given period of time;

detecting the secondary charged particles emitted from the sample surface in response to impingement of the beam; and spraying etching gas capable of etching the film onto the surface region while the beam is being caused to scan the region.

BRIEF DESCRIPTION OF THE DRAWINGS

FIGS. 2–5 have already been described above.

DESCRIPTION OF THE PREFERRED EMBODIMENTS

The present invention serves to eliminate the problems described above. The invention provides a method and apparatus for modifying a patterned film, the apparatus having an ion source for producing an ion beam, scanning electrodes and a scanning control circuit for scanning the beam, a detector that detects the secondary charged particles emanating from the sample in response to the irradiation of the beam, and a display device for displaying the pattern formed upon the sample according to the output from the detector. According to the invention, a nozzle is adjusted for spraying etching gas against only a certain portion of the pattern when the focused ion beam is caused to fall upon that portion of the pattern, the gas being activated by the ion beam and being capable of etching the material of the film upon which the pattern is formed, and the focused ion beam that irradiates and scans the sample is not permitted to move from one spot to a neighboring spot until a given period of time elapses.

In operation of the above-described structure, a desired portion of a patterned film is repeatedly scanned with the focused ion beam. The film on this portion is gradually etched away by sputtering. The etching gas which is activated by the ion beam and can chemically etch the material of the patterned film is sprayed against the desired portion. Therefore, the desired portion is rapidly removed.

Figure 3:
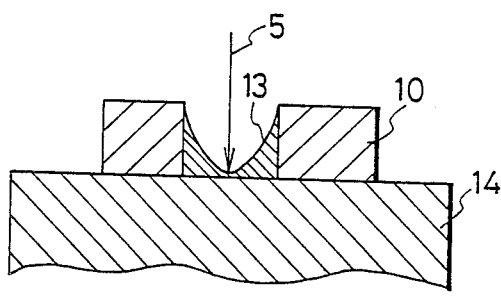
FIG. 3 is a cross-sectional view of the operation performed by a conventional apparatus.

The material of the patterned film which has been etched away by sputtering reacts with the etching gas and so it is not deposited again, in contrast to the situation shown in FIG. 3.

The nozzle is provided to spray the gas against only a desired portion of the patterned film. The focused ion beam which irradiates the sample is not shifted to the next spot until a given period of time elapses. This allows best use to be made of the effects of the chemical reaction caused by the etching gas while minimizing the amount of etching gas admitted into the apparatus. The vacuum inside the apparatus does not deteriorate. Hence, no special evacuating system is required to be installed.

Figure 1:
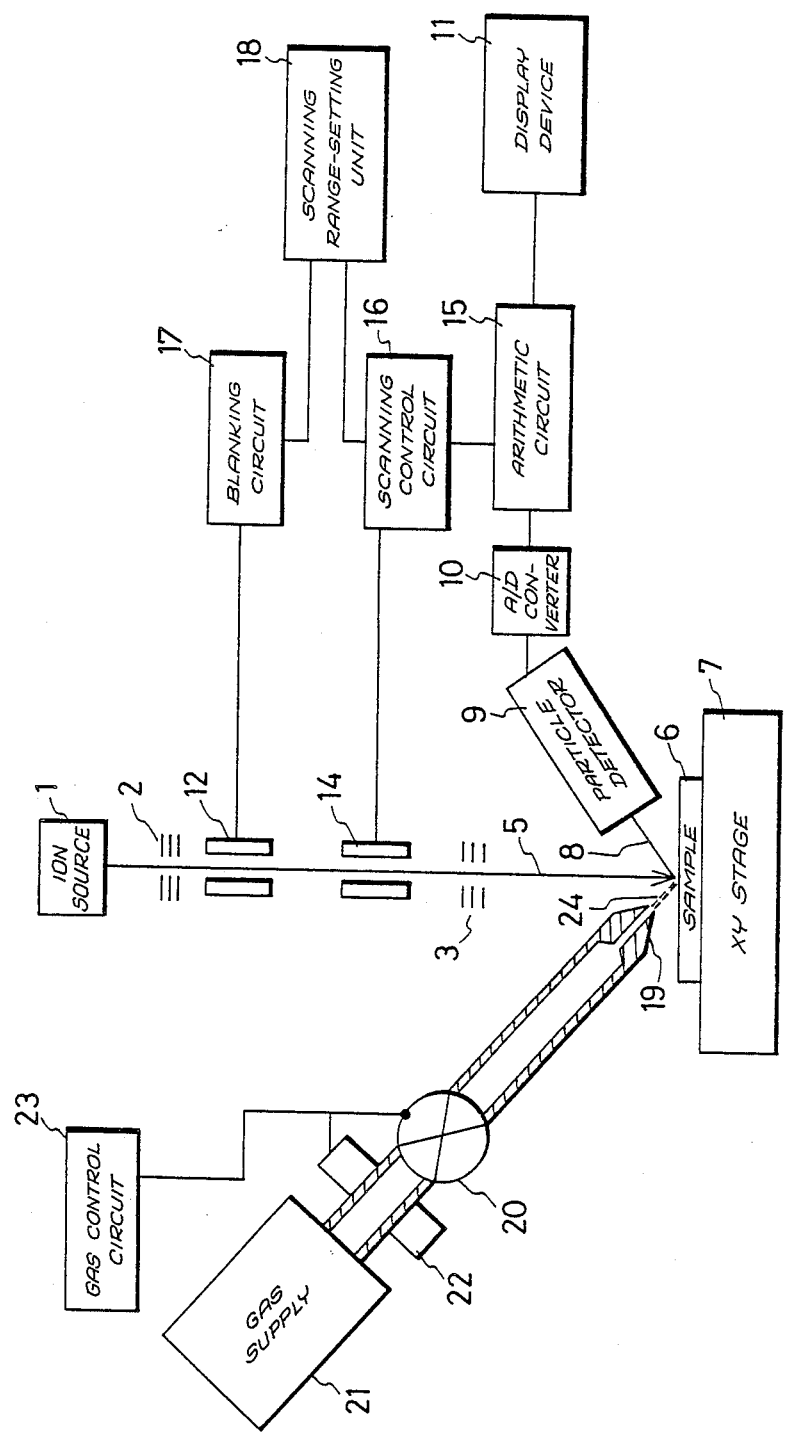
FIG. 1 is a schematic illustration of a patterned film-modifying apparatus according to a preferred embodiment of the invention.
Figure 2:
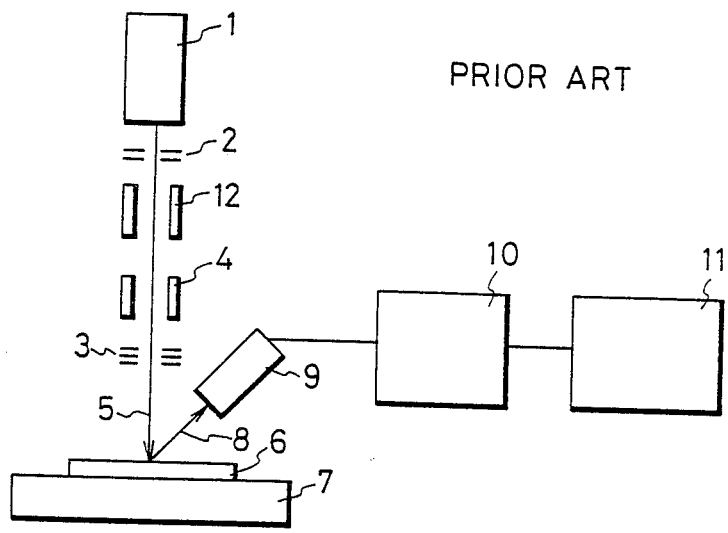
FIG. 2 is a schematic illustration of a conventional apparatus.

An embodiment of the invention is hereinafter described with reference to the drawings. FIG. 1 shows a patterned film-modifying apparatus according to the invention. An ion source 1 generates an ion beam which is extracted by pullout electrodes (not shown). The beam is then focused to a submicron diameter by an ion lens system composed of condenser lenses 2 and objective lenses 3. The focused beam 5 is caused to impinge on the surface of a sample 6. Scanning electrodes 4 are disposed along the irradiating ion beam 6 so that it may be focused onto the sample and scan it. The scanning electrodes 4 are controlled by a scanning control circuit 16 which controls the scan made by the beam 5. The sample 6 is placed on XY stage 7, which holds the sample 6 and moves it along the XY plane.

A device that sprays etching gas against the portion of the sample irradiated with the focused ion beam 5 comprises a nozzle 19 and a valve 20. The etching gas is supplied from a gas supply 21 and is sprayed locally against the surface of the sample by the nozzle. The gas spray is turned on and off by the valve 20.

Secondary charged particles 8 emanate from the surface of the sample 6 in response to the irradiation by beam 5. The particles 8 are detected by a secondary particle detector 9 which faces the surface of the sample 6. The output signal from the detector 9 is fed to an A/D converter 10 and then to an arithmetic circuit 15 which also receives a signal from the scanning control circuit 16. The signal from the detector 9 is synchronized with the signal from the scanning control circuit 16 to display the pattern on a display-processing unit 11. Blanking electrodes 12 are disposed along the irradiating ion beam to deflect the beam to a large extent in order to prevent the beam 5 from impinging on the sample 6. The blanking voltage applied between the blanking electrodes 12 is turned on and off by a blanking circuit 17. A scanning range-setting portion 18 acts to set the range in which the focused ion beam is scanned, for causing the beam 5 to impinge on a desired portion of a surface of the sample 6. The ion beam is controlled by one or both of the blanking circuit 17 and the scanning control circuit 16 within the range set by the scanning range-setting portion 18.

The patterned film is modified in the manner described below. The sample 6 having a pattern to be modified is inserted into a chamber (not shown) the inside of which is maintained at a vacuum by a vacuum pump (not shown). The sample 6 comprises a substrate of glass or silicon on which a pattern is formed out of chromium, aluminum, or other material. Data about the position of the portion to be modified is entered to drive the XY stage 7 in such a way that the portion to be modified of the sample 6 is brought to substantially the center of the range scanned by the beam 5. The beam 5 is caused to impinge on the surface of the sample 6, and then the secondary charged particles 8 emanating from the sample 6 are detected by the detector 9. The pattern formed on the surface of the sample 6 is displayed on the image display device 11. If the position of the portion to be modified is located either at one end of the screen of the display device 11 or outside the display range, then the XY stage 7 is again driven so that the portion to be modified may be placed substantially in the center of the range scanned by the beam 5. After a pattern to be modified is displayed substantially in the center of the screen of the display device 11, the range of the pattern to be modified is entered into the scanning range-setting portion 18. Then, the scanning range-setting portion 18 produces signals to the blanking electrodes 12 placed after the blanking circuit 16 and also to the scanning electrodes 4 connected after the scanning control circuit 16. The patterned film is modified by repeatedly scanning only the portion to be modified on the sample 6 with the beam 5.

When the patterned film is to be modified, the valve 20 is opened according to the signal from an etching gas control circuit 23. An air cylinder 22 brings a nozzle 19 close to the surface of the sample. Then, etching gas 24 is sprayed against only the portion of the pattern to be modified on the sample 6 by the nozzle 19. The gas 24 differs according to the material of the patterned film and the material of the instruments. Examples of the gas 24 are gaseous chlorine and gaseous fluorine halogenide, chlorine, carbon tetrachloride, xenon fluoride, and fluorine.

Preferably beam 5 is formed by ions of Be, B, Si, In, Au, Cs, Sn or Bi, derived from a source in the liquid state. The most preferred ion material is Ga.

Chemical reaction between the etching gas and the material to be removed is caused by activation of the etching gas molecules absorbed at the surface of the sample 6, the activation being effected by the focused ion beam. Thus, a chemical etching is performed. More specifically, when the surface of the sample 6 is irradiated with the focused beam, the density of the molecules of the etching gas adhering to the irradiated spot must be sufficiently high. On the other hand, the flow rate of the etching gas admitted into the apparatus must be reduced to a minimum to protect the ion source, the secondary charged particle detector, the vacuum pump, etc. Further, if the flow rate of the etching gas is too high, then the focused ion beam and the etching gas molecules will collide with each other and become scattered before they reach the surface of the sample 6. In this case, portions other than the modified portion are also etched away.

Figure 4:
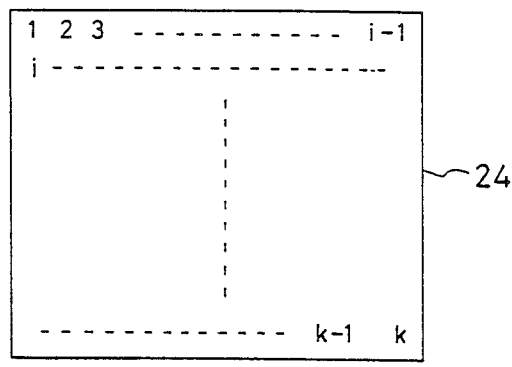
FIG. 4 is a view illustrating the scanning sequence of a focused ion beam as scanned.

A method of scanning the focused ion beam in accordance with the invention makes the best use of the effects of the chemical reaction caused by the etching gas while minimizing the amount of etching gas which must be introduced into the apparatus. In one example of this method of scanning the focused ion beam, the pattern in which the ion beam is directed across the sample as illustrated in FIG. 4 is utilized and, at the same time, a blanking voltage is applied between the blanking electrodes 12 according to the signal from the blanking circuit during a given period of time, i.e., until the beam moves to the next spot, to prevent the beam from falling on the sample 6 during beam movement.

Figure 6:
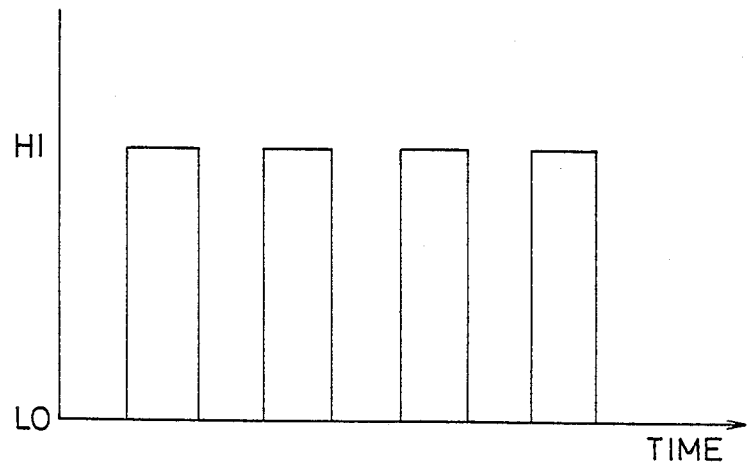
FIG. 6 is a diagram showing the variation of a blanking voltage with time, the voltage being applied when a focused ion beam is scanned in accordance with the invention.

FIG. 6 shows the variation of the blanking voltage with time when the ion beam is scanned in accordance with the invention. When the blanking voltage is at level LO, the ion beam is allowed to impinge on the sample. When the voltage is at level HI, the beam is prevented from impinging on the sample. In particular, the sample is irradiated with the beam at the blanking voltage LO for a given time. Then, the voltage is switched to level HI to stop the irradiation for a given time. Subsequently, the beam is moved to the next spot and the blanking voltage is returned to level LO to irradiate the sample with the focused beam for a given period. This series of operations is repeated.

The time for which the blanking voltage LO is maintained is set independently of the time for which the voltage HI is maintained. These times are from 1 to hundreds of microseconds.

Figure 5:
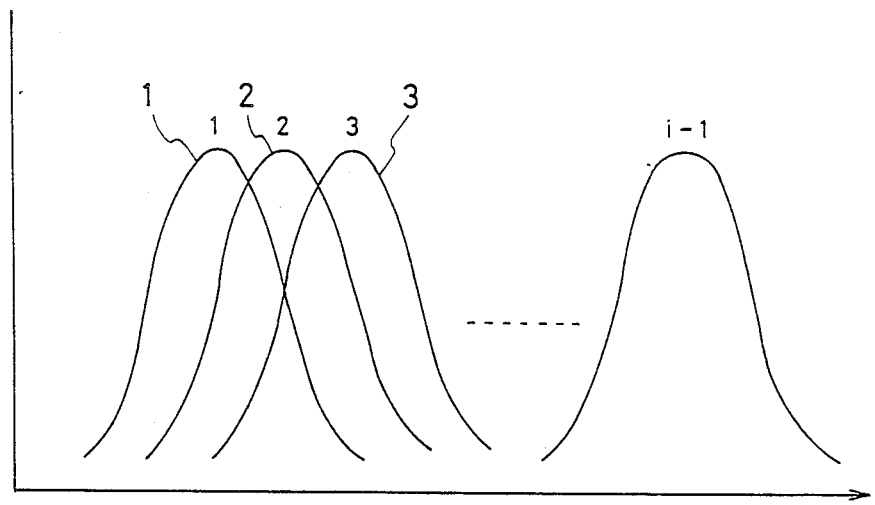
FIG. 5 is a diagram showing the intensity distribution of a focused ion beam irradiating a line beginning with spot i and ending with spot i−1 shown in FIG. 4.

The spot-blanking period for which the focused ion beam is not directed to the sample while going to the next spot is created for the following reason. The ion beam is scanned in the sequence as illustrated in conjunction with FIG. 4. During this process, the intensity distribution curves overlap with each other as shown in FIG. 5. The molecules of the etching gas are permitted to adhere during the spot blanking period, contributing to chemical reaction caused when the next irradiation is effected. That is, the given period for allowing the focused beam to shift to the next spot is a time taken for the etching gas molecules to cause a sufficient amount of chemical reaction in the overlapping portions of the intensity distribution curves. If the spot blanking period were zero, then the amount of etching gas adhering would be insufficient in the overlapping portions unless the flow rate of the etching gas were increased considerably. Thus, the invention serves to increase the proportion of gas molecules absorbed by the material to be etched away.

Figure 7:
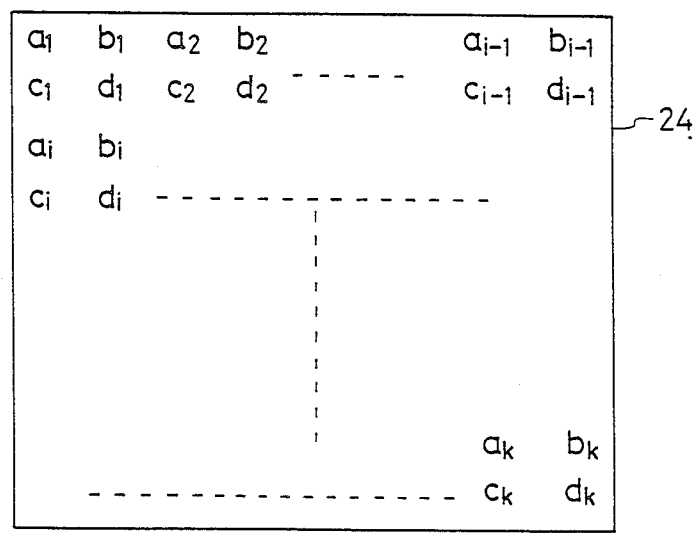
FIG. 7 is a view illustrating the sequence in which a focused ion beam is scanned according to an embodiment of the invention.

A second example of the novel method of scanning the focused ion beam is next described by referring to FIG. 7, where the range 24 scanned by the focused ion beam apparatus for modification of the sample is similar to the range shown in FIG. 4. The beam is caused to impinge on the sample at spots $a_1, a_2, \ldots, a_{i-1}, a_i, \ldots, a_k, b_1, b_2, \ldots, b_{i-1}, b_i, \ldots, b_k, c_1, c_2, \ldots, c_{i-1}, c_i, \ldots, c_k, d_1, d_2, \ldots, d_{i-1}, d_i, \ldots, d_k$. In this second example, the beam is made to fall on the sample at spots $a_1, a_2, \ldots, a_{i-1}, a_i, \ldots, a_k, b_1, b_2, \ldots, b_{i-1}, b_i, \ldots, b_k, c_1, c_2, \ldots, c_{i-1}, c_i, \ldots, c_k, d_1, d_2, \ldots, d_{i-1}, d_i, \ldots, d_k$ in that order thus completing one frame of irradiation. This pattern of irradiation is repeated to make the desired modification.

In this method of scanning the focused ion beam, the scanning voltage applied between the scanning electrode 4 is controlled by the scanning control circuit 16. According to this method, a certain period of time elapses as the beam is deflected from one spot, e.g., $d_1$, to a neighboring spot, e.g., $b_i$, $c_1$, $c_2$, or $b_1$. During this time, the density of the molecules of etching gas adhering to the surface of the sample 6 increases to a sufficiently high level. Also according to this method, two successively irradiated spots having no overlapping intensity distribution portions, unlike the case shown in FIG. 5. For this reason, the density of the etching gas molecules adhering to the surface of the sample 6 is always maintained at a sufficiently high level. In other words, if the two successively irradiated spots are so spaced from each other than no overlap of intensity distribution is created between them, then the chemical reaction of the etching proceeds efficiently. The novel method of scanning the focused ion beam further reduces the total amount of etching gas which must be admitted into the apparatus in order to have a sufficient amount of etching gas adhere to the surface of the sample 6 by at least one order of magnitude as compared with the case where a patterned film is modified using etching gas together with the prior art method of scanning a focused ion beam.

The sample can be either a photomask used for fabrication of ICs or an integrated circuit itself.

Those portions of a pattern which should be removed can be removed rapidly. When the material forming the pattern is etched away by sputtering, it reacts with the etching gas and so it is not again deposited, unlike the case shown in FIG. 3.

Also, a nozzle is provided to spray the gas against only a desired portion of the pattern. Further, the ion beam which irradiates and scans the workpiece is not permitted to move from one spot to another until a given period of time elapses. Consequently, the best use is made of the effects of the chemical reaction caused by the etching gas while minimizing the amount of etching gas admitted into the apparatus. Furthermore, the vacuum inside the apparatus does not deteriorate. Hence, no special evacuating system is needed.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. Apparatus for modifying a patterned film on a sample surface, comprising:
    means for producing a focussed ion beam and for causing the beam to impinge upon the sample surface to microscopically machine a small region of the surface which contains the patterned film, impingement of the beam causing secondary charged particles to be emitted from the sample surface;
    scanning means disposed for causing the focussed beam to scan the sample surface;
    detecting means disposed for detecting the secondary charged particles emitted from the sample surface in response to impingement of the beam;
    display means connected to said detecting means for producing a display of the pattern of the film in response to the output of said detecting means;
    means disposed for spraying etching gas capable of etching the film onto the surface region while the beam is being caused to scan the region; and
    scanning control means coupled to said scanning means for causing the beam to impinge on each one of a plurality of spots in the region in a given sequence and to impinge on each spot for a given period of time.

2. Apparatus as defined in claim 1 wherein said scanning means comprises scanning electrodes disposed to deflect the beam, and said scanning control means comprise a circuit connected to apply a deflection voltage to said electrodes.

3. Apparatus as defined in claim 1 wherein said scanning control means are operative for causing the beam to impinge on the spots in a sequence such that the beam impinges successively on spots which are spaced a given distance apart and are separated from one another by other spots.

4. Apparatus as defined in claim 1 further comprising beam blanking means disposed for preventing the beam from impinging on the surface region during selected time intervals.

5. A method for modifying a patterned film on a sample surface, comprising:
    producing a focussed ion beam and causing the beam to impinge upon the sample surface to microscopically machine a small region of the surface which contains the patterned film, impingement of the beam causing secondary charged particles to be emitted from the sample surface;
    causing the focussed beam to scan the sample surface by impinging on each one of a plurality of spots in the region in a given sequence and impinging on each spot for a given period of time;
    detecting the secondary charged particles emitted from the sample surface in response to impingement of the beam; and
    spraying etching gas capable of etching the film onto the surface region while the beam is being caused to scan the region.

6. A method as defined in claim 5 further comprising preventing the beam from impinging on the surface region during selected time intervals.

7. A method as defined in claim 6 wherein the selected time intervals are between successive given periods of time when the beam impinges on each spot.

* * * * *